(12) United States Patent
Rackley (10) Patent No.: US 9,274,166 B2
(45) Date of Patent: Mar. 1, 2016

(54) PIN VERIFICATION DEVICE AND METHOD

(71) Applicant: Donald Jay Rackley, Heath, TX (US)

(72) Inventor: Donald Jay Rackley, Heath, TX (US)

(73) Assignee: Fujitsu Limited, Kawasaki-shi (JP)

( * ) Notice: Subject to any disclaimer, the term of this patent is extended or adjusted under 35 U.S.C. 154(b) by 219 days.

(21) Appl. No.: 14/010,315

(22) Filed: Aug. 26, 2013

(65) Prior Publication Data

US 2015/0054536 A1 Feb. 26, 2015

(51) Int. Cl.
*G01R 31/20* (2006.01)
*G01R 31/28* (2006.01)
*G01R 31/04* (2006.01)
*G01R 31/317* (2006.01)

(52) U.S. Cl.
CPC .......... *G01R 31/2887* (2013.01); *G01R 31/046* (2013.01); *G01R 31/31713* (2013.01)

(58) Field of Classification Search
CPC ............. G01R 1/0466; G01R 1/06722; G01R 1/07314; G01R 1/0735; G01R 31/025; G01R 31/2801; G01R 31/2891; G01R 31/311; G01R 31/318572; G01R 1/046; G01R 31/2887; G01R 31/31713; H01H 13/7006; H01H 2203/038; H01H 2205/016; H01H 2209/004; H04Q 9/02; H05K 1/0298; H05K 2201/09918; H05K 3/4069
See application file for complete search history.

(56) References Cited

U.S. PATENT DOCUMENTS

| | | | |
|---|---|---|---|
| 4,084,875 A * | 4/1978 | Yamamoto | 439/274 |
| 4,462,155 A * | 7/1984 | Brunelle et al. | 29/593 |
| 4,686,465 A | 8/1987 | Kruger | |
| 4,849,743 A * | 7/1989 | Ohno | 340/687 |
| 5,049,813 A | 9/1991 | Van Loan et al. | |
| 5,444,387 A | 8/1995 | Van Loan et al. | |
| 5,818,248 A | 10/1998 | St. Onge | |
| 5,945,836 A | 8/1999 | Sayre et al. | |
| 6,140,830 A | 10/2000 | Ott | |
| 6,407,565 B1 | 6/2002 | Sayre et al. | |
| 6,469,531 B1 | 10/2002 | Sayre et al. | |
| 7,420,382 B2 | 9/2008 | Ko et al. | |
| 7,616,019 B2 | 11/2009 | Oshetski et al. | |
| 7,696,767 B2 | 4/2010 | Inoue et al. | |
| 7,852,096 B2 | 12/2010 | Eickhoff et al. | |
| 8,269,507 B2 | 9/2012 | Hall | |
| 2004/0140821 A1 | 7/2004 | Lee | |
| 2007/0264878 A1 | 11/2007 | Hirobe et al. | |
| 2011/0148448 A1 | 6/2011 | St. Onge et al. | |
| 2011/0273203 A1 | 11/2011 | Romanov et al. | |
| 2012/0019275 A1 | 1/2012 | Dehmel et al. | |

* cited by examiner

*Primary Examiner* — Vinh Nguyen

(74) *Attorney, Agent, or Firm* — Baker Botts L.L.P.

(57) ABSTRACT

A device of one embodiment includes a sensor, an indicator electrically connected to the sensor, a first base portion including a plurality of first channels, a second base portion including a plurality of second channels and located between the first base portion and the sensor, and a plurality of pins. Each pin includes first and second ends, and each pin passes through a respective first channel and a respective second channel such that the first end extends beyond the first base portion away from the sensor and the second end extends beyond the second base portion toward the sensor. Each pin is adjustably disposed within the respective first and second channels such that each pin is operable to move along a longitudinal axis of the pin. Furthermore, the sensor is operable to determine whether all pins of the plurality of pins are positioned proximate to the sensor.

20 Claims, 6 Drawing Sheets

PIN VERIFICATION DEVICE AND METHOD

TECHNICAL FIELD

The present invention relates generally to the field of electronic devices and assemblies and more particularly to a pin verification device and method.

BACKGROUND

Various electronic components may be connected to a circuit board. Such components may couple to a circuit board via different types of coupling mechanisms. For example, certain components may be mounted on a circuit board via a "surface-mount" construction, while other components may be connected to the circuit board via a "through-hole" construction. Through-hole attachment may involve inserting one or more component pins of the component into corresponding holes in the circuit board. These holes may pass completely through the circuit board and connect the electronic component to the circuit board physically and/or electrically.

Once an electronic component is coupled to a circuit board, the connection may be tested. For example, electrical tests may apply certain voltages or currents to a portion of an electrical component to determine whether one or more components are electrically connected to the circuit board. However, such electrical tests may use current and/or voltage levels that are different from current and/or voltage levels that may applied during normal operation of the circuit board. In certain instances, an electronic component that has one or more component pins insufficiently inserted into the circuit board may pass a conventional electrical test but later fail under operational conditions that involve higher current and/or voltage levels. For example, an electronic component may have incidental or casual contact between the component lead and the circuit board despite improper insertion of the electronic component into the circuit board.

SUMMARY

According to the present invention, certain disadvantages and problems associated with previous circuit board testing devices and methods may be reduced or eliminated.

According to one embodiment, a device includes a sensor, an indicator electrically connected to the sensor, a first base portion including a plurality of first channels, a second base portion including a plurality of second channels and located between the first base portion and the sensor, and a plurality of pins. Each pin includes first and second ends, and each pin passes through a respective first channel and a respective second channel such that the first end extends beyond the first base portion away from the sensor and the second end extends beyond the second base portion toward the sensor. Each pin is adjustably disposed within the respective first and second channels such that each pin is operable to move along a longitudinal axis of the pin. Furthermore, the sensor is operable to determine whether all pins of the plurality of pins are positioned proximate to the sensor.

According to another embodiment, a method determines whether a plurality of component pins of a component coupled to a first side of a circuit board are inserted a sufficient depth into a plurality of holes of the circuit board. The method includes positioning a device proximate to a second side of the circuit board, the second side opposite the first side. The device includes a sensor, an indicator electrically connected to the sensor, a first base portion including a plurality of first channels, a second base portion including a plurality of second channels and located between the first base portion and the sensor, and a plurality of pins. Each pin includes first and second ends, and each pin passes through a respective first channel and a respective second channel such that the first end extends beyond the first base portion away from the sensor and the second end extends beyond the second base portion toward the sensor. Each pin is adjustably disposed within the respective first and second channels such that each pin is operable to move along a longitudinal axis of the pin. Furthermore, the sensor is operable to determine whether all pins of the plurality of pins are positioned proximate to the sensor. The device is positioned such that each pin of the plurality of pins is aligned with a respective hole of the plurality of holes. The method also includes inserting the plurality of pins into the respective holes such that one or more first ends of the plurality of pins contacts one or more component pins. The method also includes determining whether the plurality of component pins are inserted a sufficient depth into the plurality of holes based on a state of the indicator.

According to another embodiment, a device includes a housing, a sensor situated within the housing, an indicator electrically connected to the sensor, a first base plate connected to a first end of the housing, and a second base plate situated within the housing between the first base plate and the sensor. The first base plate includes a plurality of first channels, and the second base plate includes a plurality of second channels. The device also includes two or more rows of pins, each row including two or more pins. Each pin includes first and second ends, and each pin passes through a respective first channel and a respective second channel such that the first end extends beyond the first base portion away from the sensor and the second end extends beyond the second base portion toward the sensor. Each pin is adjustably disposed within the respective first and second channels such that each pin is operable to move along a longitudinal axis of the pin. The device also includes a plurality of springs, each spring engaging a respective pin of the plurality of pins and operable to exert a force on the respective pin along the longitudinal axis of the respective pin away from the sensor. Furthermore, the sensor is operable to determine whether all pins of the plurality of pins are positioned proximate to the sensor.

Particular embodiments of the present invention may provide one or more technical advantages. These devices and methods may provide improved detection of electronic components that are improperly connected to circuit boards. Certain embodiments may more effectively detect improperly connected electronic components that might otherwise pass certain conventional testing methods, such as testing electrical connectivity between the electronic component and the circuit board. Furthermore, certain embodiments may provide a more cost-efficient mechanism for identifying electronic components that are improperly connected to a circuit board. Certain embodiments may also be less power-intensive than alternative electronic component testing methods. Some embodiments may provide more detailed information about the connection of an electronic component to circuit board, which may facilitate more particularized responses to different connection problems. Certain embodiments may provide adjustable configurations that may allow a single device to be used for testing multiple electronic components having different configurations. Certain embodiments may also provide improved flexibility by allowing component pins with different but equally acceptable insertion depths to be verified simultaneously.

Certain embodiments of the present invention may provide some, all, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present disclosure and its features and advantages, reference is now made to the following description, taken in conjunction with the accompanying drawings, in which.

DESCRIPTION OF EXAMPLE EMBODIMENTS

Figure 1A:
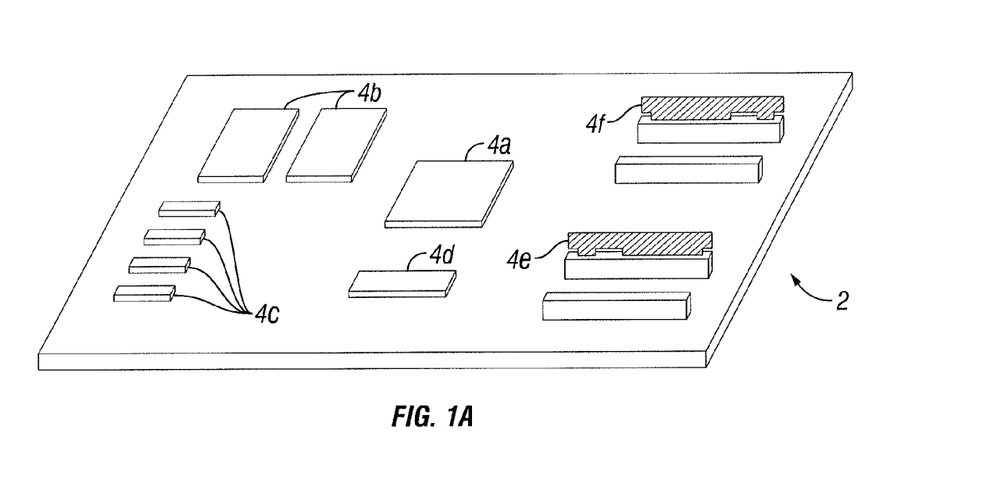
FIG. 1A illustrates an isometric view of an example circuit board.

FIG. 1A illustrates an isometric view of an example circuit board 2. Circuit board 2 includes electronic components 4a-f.

Circuit board 2 may be any device operable to mechanically support and electrically connect electronic components 4. As used herein, "circuit board" is intended to encompass printed circuit boards, printed wiring boards, circuit assemblies, wiring assemblies, or any other structure operable to support and/or connect one or more electronic components. Circuit board 2 may be composed of fiberglass, any suitable plastic, or any other suitable material for connecting electronic components 4. Circuit board 2 may contain one or more attachment points for one or more electronic components 4. Circuit board 2 may contain additional components such as capacitors, resistors, or other devices. Circuit board 2 may also contain conductive wiring, pathways, and/or tracks (not shown) that may electrically connect one or more electronic components 4 with other electronic components 4 or with other components of circuit board 2. In certain embodiments, such pathways or tracks may be connected, printed, or etched onto the surface of circuit board 2. Various embodiments of circuit board 2 may be used in any suitable electronic device. For example, certain embodiments of circuit board 2 may be used in desktop computers, laptops, smartphones, tablet computers, servers, audio receivers, or in any suitable electronic device.

Electronic components 4 may be any electronic device that is capable of connecting to circuit board 2. Electronic components 4 may facilitate data processing, powering, and/or any suitable function of circuit board 2 or a device incorporating circuit board 2. Electronic components 4 may connect to circuit board 2 via through-hole connections, surface-mount connections, or any suitable connection method. For example, electronic components 4a-4d may utilize through-hole connections while electronic components 4e-f utilize surface-mount connections. Furthermore, certain electronic components 4 may be soldered or otherwise fastened to circuit board 2 after being initially connected. Certain electronic components 4 may include one or more component pins 30 (not shown) that are operable to facilitate data communication and/or power transfers between the electronic component 4 and circuit board 2. Electronic components 4 may be power connectors (e.g., "power bugs"), processors, cards, memory units, or any suitable electronic device capable of connecting to circuit board 2. Furthermore, circuit board 2 may include any suitable number, type, and/or arrangement of electronic components 4.

Figure 1B:
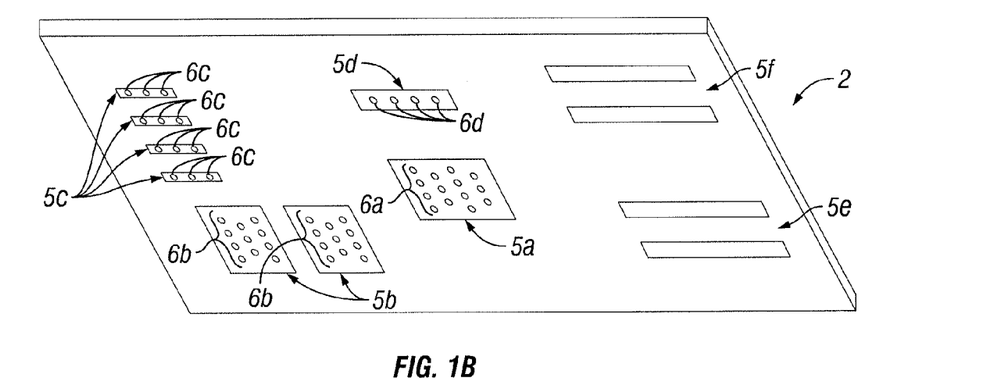
FIG. 1B illustrates a different isometric view of the example circuit board of FIG. 1A.

FIG. 1B illustrates a different isometric view of the example circuit board 2 of FIG. 1A. FIG. 1B shows the opposing side of circuit board 2 that was not visible in FIG. 1A. As illustrated in FIG. 1B, circuit board 2 includes regions 5a-f and holes 6a-d.

Regions 5a-f represent the portions of circuit board 2 that correspond to the location of electronic component 4a-f, respectively, on the opposing side of circuit board 2. In certain embodiments, regions 5a-d may include holes 6a-d, respectively, to facilitate through-hole connections for electronic component 4a-d, respectively. Regions 5e and 5f may not contain any holes 6 because electronic component 4e and 4f are not connected to circuit board 2 via through-hole connections. For example, components 4e and 4f may be connected via surface mounting and may not attach via one or more holes 6 that pass all the way through circuit board 2.

Holes 6 may be any hole passing completely through circuit board 2 to facilitate through-hole connections. Holes 6 may be plated through-holes or non-plated through-holes. An electronic component 4 may include one or more component pins 30 (not shown) that are inserted into a respective hole 6. The number and arrangement of holes 6 may correspond to the number and arrangement of component pins 30 for a particular type of electronic component 4. For example, holes 6a include four rows of holes 6 having a particular arrangement, and electronic component 4a has corresponding component pins 30 (not shown) having the same spatial arrangement. Furthermore, component pins 30 may extend a certain depth into their respective holes 6. Sufficient insertion of component pins 30 into holes 6 may facilitate proper functioning of the electronic component 4. The insertion of component pins 30 into holes 6 is discussed further with respect to FIGS. 5A-B. Various regions 5 of circuit board 2 may have any suitable number and arrangement of holes 6.

Figure 2:
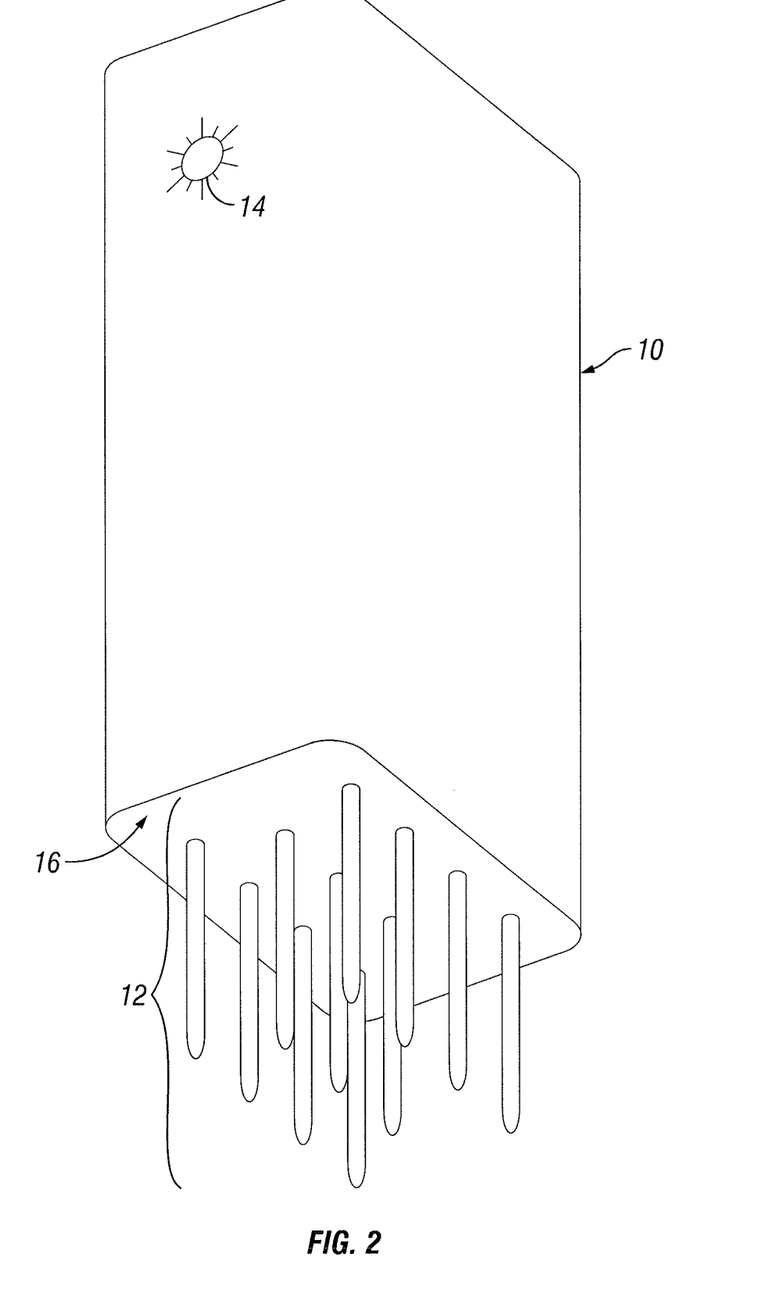
FIG. 2 illustrates an example pin verification device.

FIG. 2 illustrates an example pin verification device 10. Pin verification device 10 is operable to determine whether component pins of an electronic component are sufficiently inserted into corresponding holes of a circuit board. Pin verification device 10 may be any suitable size, shape, or configuration. Pin verification device 10 includes pins 12, indicator 14, and base portion 16.

Pins 12 may be any structure operable to be inserted into holes 6. Pins 12 may be composed of plastic, wood, metal, or any suitable material. In some embodiments, pins 12 may be composed of an electrically insulating material. Pins 12 may have any suitable width, length, and/or shape. For example, pins 12 may have any suitable cross-sectional shape. As another example, in various embodiments, one or more portions of a pin 12 may have a width of between 0.1 and 2 millimeters, between 0.3 and 0.7 millimeters, or approximately 0.5 millimeters, though such dimensions are not required. Other embodiments may have larger or smaller pins. The width of pins 12 may depend on the diameter of holes 6. Furthermore, in certain embodiments, different pins 12 within the same pin verification device 10 may have different widths, lengths, shapes, and/or materials. Thus, a particular embodiment of pin verification device 10 may include identically configured pins 12, while another embodiment of pin verification device 10 may include differently configured pins 12. Furthermore, various embodiments may have any suitable number and arrangement of pins 12 to correspond to the number and arrangement of holes 6 in circuit board 2. The number, arrangement, and depth of pins 12 may be fixed or adjustable. Pins 12 are operable to be inserted into holes 6 in order to determine whether component pins 30, which may be inserted into the opposing side of holes 6, are sufficiently inserted into holes 6. Pins 12 may therefore provide improved detection of improperly attached electronic components 4. The configuration and operation of pins 12 is described in further detail below with respect to FIGS. 3A-B, 4, 5A-B, and 6.

Indicator 14 may be any component operable to indicate whether component pins 30 are sufficiently inserted into holes 6. Indicator 14 may be a light, a sound-emitting component, a display (e.g., a text display, video display, or any suitable display), any suitable component capable of indicating one or more states, or any combination thereof.

Indicator 14 is electrically connected to sensor 24 (not shown) and may be triggered or otherwise controlled by sensor 24. In some embodiments, indicator 14 may indicate a binary state. For example, indicator 14 may be a light that is turned on or off depending on whether all component pins 30 of an electronic component 4 are inserted a sufficient depth into holes 6. Such embodiments may provide a cost-efficient mechanism for identifying electronic components 4 that are improperly connected to circuit board 2. In other embodiments, indicator 14 may indicate various states. For example, indicator 14 may include multiple lights, each of which indicates whether a particular component pin 30 is sufficiently inserted into a particular hole 6. As another example, indicator 14 may be a display screen that displays the insertion depth of one or more component pins 30 and/or one or more pins 12. Such embodiments may provide more detailed information about the connection of an electronic component 4 to circuit board 2, which may facilitate more particularized responses to different connection problems.

Base portion 16 may be any component operable to guide the position of one or more pins 12. Base portion 16 may be a plate with one or more channels, each channel configured to receive a pin 12, allowing pin 12 to pass through base portion 16. In other embodiments, base portion 16 may consist of a plurality of guides (e.g., rods, bars, or other suitable components extending across the width of pin verification device 10) operable to receive and position one or more pins 12. In some embodiments, the number, size, shape, and/or location of channels in base portion 16 may be fixed. Such embodiments may provide a cost-efficient mechanism for orienting pins 12. In other embodiments, the number, size, shape, and/or location of channels in base portion 16 may be configurable. For example, base portions 16 and/or 18 may include a plurality of guide rods extending across the width of housing 15, and these guide rods may include one or more adjustment mechanisms (e.g., a knob, clamp, roller, screw, slider, or any suitable adjustment mechanism) that adjusts the position of the guide rod along one or more tracks in housing 15. Adjusting the position of such guide rods may enable adjustment of the position of the channels and, therefore, the arrangement of pins 12. Such embodiments may provide a dynamic means of configuring pin verification device 10 to accommodate different types of holes 6 and/or electronic components 4.

Figure 3A:
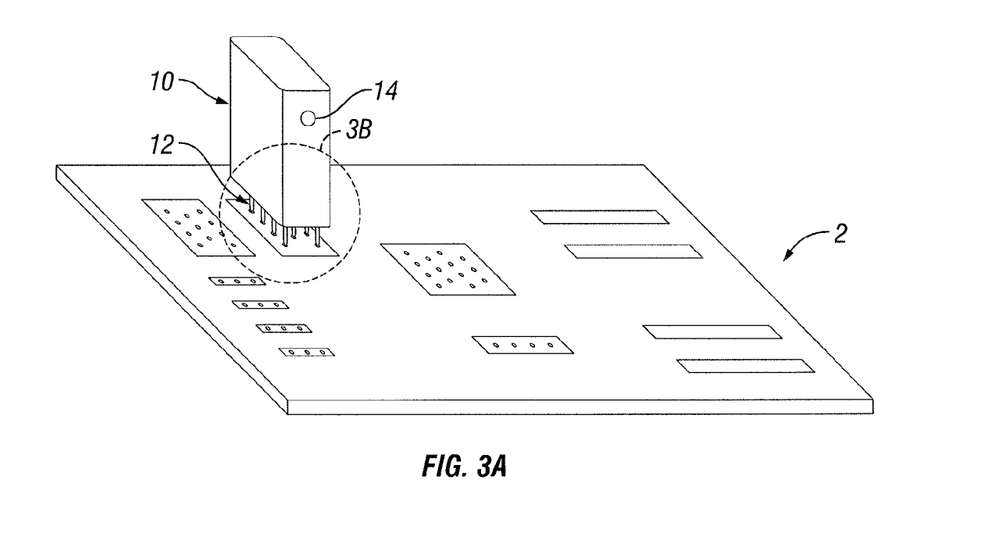
FIG. 3A illustrates an example pin verification device positioned over an example circuit board.
Figure 3B:
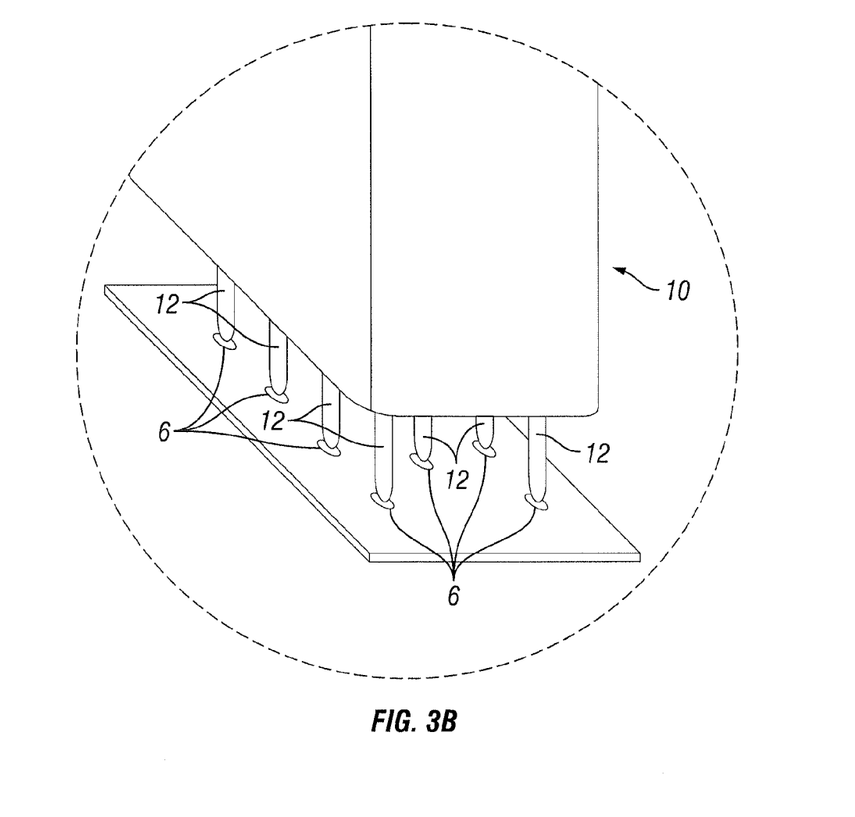
FIG. 3B illustrates a close-up view of the example pin verification device positioned over the example circuit board of FIG. 3A.

FIGS. 3A-B illustrate an example pin verification device 10 positioned over an example circuit board 2. Pin verification device 10 is positioned proximate to the side of circuit board 2 opposite electronic components 4 (not shown), allowing pins 12 to be inserted into holes 6 opposite component pins 30 (not shown). Pin verification device 10 is positioned such that each pin 12 is aligned with a respective hole 6. Pin verification device 10 may then be moved toward circuit board 2 to insert pins 12 into the respective holes 6 such that one or more ends of pins 12 contact one or more component pins 30, which may allow Pin verification device 10 to determine whether component pins 30 are inserted a sufficient depth into holes 6 based on the state of indicator 14. The operation of pin verification device 10 is explained in further below with respect to FIGS. 4, 5A-B, and 6A-B.

Figure 4:
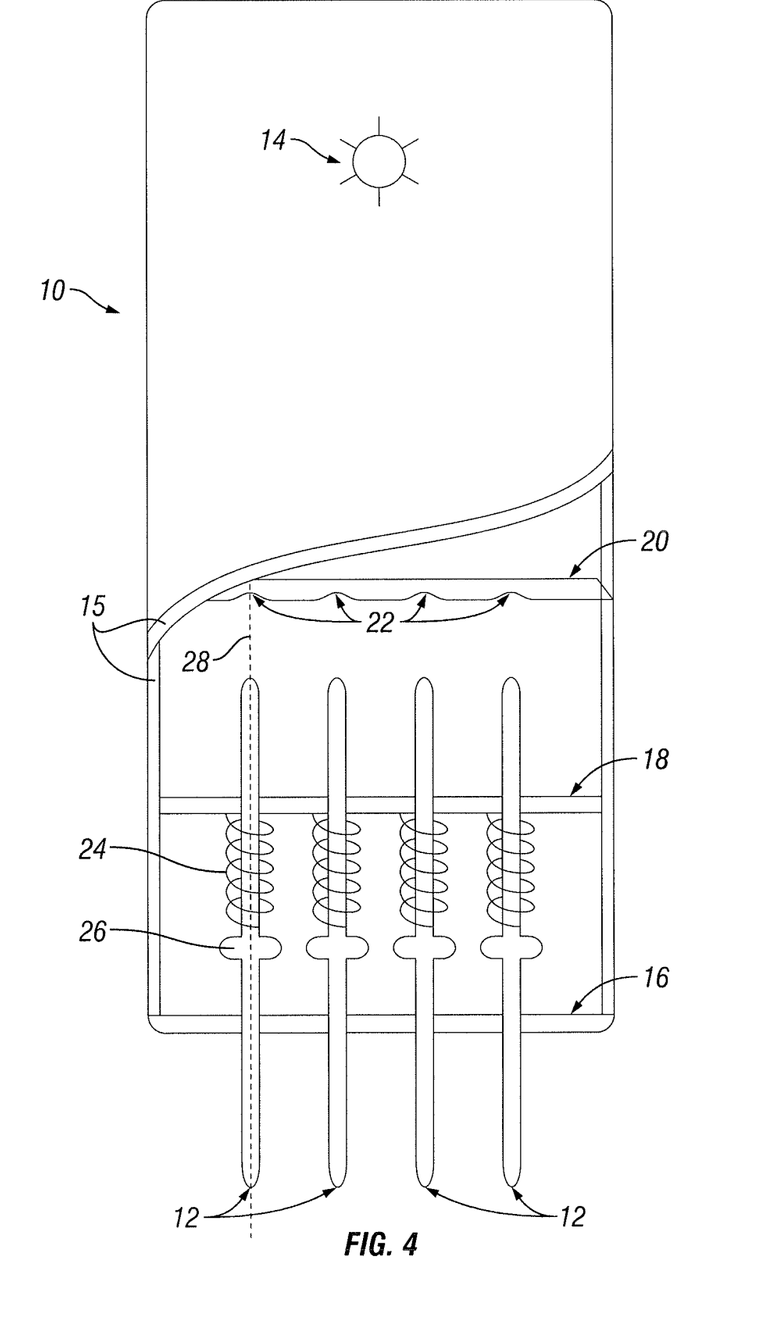
FIG. 4 illustrates a side view of an example pin verification device.

FIG. 4 illustrates a side view of an example pin verification device 10. Pin verification device 10 includes pins 12, indicator 14, housing 15, base portions 16 and 18, sensor 20, and spring 24. For purposes of illustration, the bottom half of housing 15 has been cut out to show the internal components of pin verification device 10.

Housing 15 may be any structure operable to support pins 12, indicator 14, base portions 16 and 18, sensor 20, and spring 24. Housing 15 may be composed of plastic (e.g., nylon), metal, any other suitable material, or any combination thereof. In some embodiments, housing 15 may have a fixed size and/or shape, while in other embodiments, housing 15 may be adjustable. In some embodiments, support pins 12, indicator 14, base portions 16 and 18, sensor 20, and/or spring 24 may be housed internally. In other embodiments, one or more portions of one or more such components may be housed externally. Housing 15 may have any appropriate size, shape, and/or configuration to accommodate support pins 12, indicator 14, base portion 16, base portion 18, sensor 20, and spring 24.

Base portion 16 may have any structure, configuration, and/or function described above with respect to FIG. 2. Base portion 16 may be attached at the base of housing 15, though this is not required. As shown in FIG. 2, the location of channels in base portion 16 may determine the configuration of pins 12. In certain embodiments, the location, number, and/or size of these channels may be fixed, while in other embodiments, the location, number, and/or size of these channels may be adjustable. For example, base portions 16 and/or 18 may include a plurality of guide rods extending across the width of housing 15, and these guide rods may include one or more adjustment mechanisms (e.g. a knob, clamp, roller, screw, slider, or any suitable adjustment mechanism) that adjusts the position of the guide rod along one or more tracks in housing 15. Adjusting the position of such guide rods may enable adjustment of the position of the channels and, therefore, the arrangement of pins 12. Embodiments providing adjustable configurations of base portion 16 may allow a single pin verification device 10 to be used for testing electronic components 4 having different configurations of component pins 30 (not shown).

Base portion 18 may have any structure, configuration, and/or function described above with respect to base portion 16. Base portion 18 may be attached to housing 15, though this is not required. As shown in FIG. 2, the location of channels in base portion 18 may determine the configuration of pins 12. In certain embodiments, the location, number, and/or size of these channels may be fixed, while in other embodiments, the location, number, and/or size of these channels may be adjustable. For example, base portion 18 may include an adjustment mechanism (e.g., a knob, clamp, roller, screw, slider, or any suitable adjustment mechanism) that adjusts the position of base portion 18 relative to sensor 20 along one or more tracks in housing 15. Embodiments providing adjustable configurations of base portion 18 may allow a single pin verification device 10 to be used for testing electronic components 4 having different configurations of component pins 30 (not shown).

Sensor 20 may be any component operable to detect the proximity of one or more pins 12. Sensor 20 may detect the proximity of pins 12 using any suitable mechanism. In some embodiments, pins 12 may trigger sensor 20 by physically contacting sensor 20. For example, pins 12 may trigger sensor 20 by pressing a button, opening or closing a switch (see, e.g., switches 32 of FIGS. 5A-B), or any suitable mechanism. In other embodiments, pins 12 may affect sensor 20 at a distance. For example, sensor 20 may include one or more capacitive sensors that measure a change in capacitance when a pin 12 moves within a threshold distance of sensor 20. As a particular example, the capacitance experienced by a capacitive sensor may be affected by the interaction of pin 12 with the electric field of the capacitive sensor. The resulting change in capacitance when pin 12 moves proximate to the capacitive sensor may be measured, and a threshold change in the capacitance may therefore indicate the presence of pin 12. Under certain conditions, sensor 20 may trigger a change in the state of indicator 14. For example, sensor 20 may trigger indicator 14 when all pins 12 are proximate to sensor 20. As used herein, a pin 12 is considered "proximate" to sensor 20 when it is sufficiently close to trigger the sensing mechanism of sensor 20. Depending on the configuration of pin 12 (e.g., the length of pin 12 extending out from base portion 16 away from sensor 20 or the length of pin 12 extending in from base portion 18 toward sensor 20) and the "proper" insertion depth of particular component pins 30, different distances between base portion 18 and sensor 20 may be used to change the "starting" distance between pin 12 and sensor 20 (i.e. the distance between pin 12 and sensor 20 when pin 12 is not pressing against a component pin 30). In some embodiments, the distance between base portion 18 and base portion 20 may be fixed, while in other embodiments, this distance may be adjustable. Such adjustment may allow certain embodiments to be configured to work with different "proper" insertion depths of various component pins 30.

In the illustrated embodiment, sensor 20 includes multiple sensing regions 22. Sensing region 22 may be any portion of sensor 20 that is operable to distinctly detect the proximity of a particular pin 12. For ease of illustration, only a single row of sensing regions 22 is shown, though other rows may be present. Sensing regions 22 may be switches, buttons, capacitive sensors, or any suitable component operable to detect the proximity of a pin 12. For example, sensing regions 20 may be switches that may be opened or closed by pins 12. As another example, sensing regions be gaps in a circuit that may be closed when an electrically conductive portion of pin 12 is positioned to fill the gap. Each sensing region 22 may correspond to a respective pin 12. For example, a particular sensing region 22 may be located at the projection of the longitudinal axis 28 of the respective pin 12 onto sensor 20 such that pin 12 contacts sensing region 22 (or moves proximate to sensing region 22 without contacting it) when the pin 12 moves a threshold distance toward sensor 20. In some embodiments, sensing regions 22 allow pins 12 to move an additional distance after contacting sensing region 22. Such "give" may allow sensor 20 to register additional contacts by other pins 12 as they extend farther into their respective holes 6, which may allow pin verification device 10 to detect additional component pins 30 that may be inserted shorter, but still sufficient, distances into the other side of the holes 6. In some embodiments, the location of sensing regions 22 within sensor 20 may be fixed, while in other embodiments, the location may be adjustable to correspond to adjustable positions of pins 12.

Spring 24 may be any component operable to exert force along the longitudinal axis of pin 12. Spring 24 may exert force on pin 12 to ensure that pin 12 is sufficiently extended away from sensor 12 until contacting component pin 30. This may help prevent pin 12 from sticking against the wall of hole 6 due to friction when it is being inserted. While FIG. 4 shows spring 24 as a coiled spring, any suitable spring structure may be used. Spring 24 may be a coiled spring, an elastic material, a compressible material, or any suitable structure capable of exerting force along the longitudinal axis of pin 12. In some embodiments, spring 24 may engage base portion 18 to press down on pin 12 (as shown in FIG. 4). In alternative embodiments, spring 24 may engage base portion 16 to pull pin 12 away from sensor 20. For example, spring 24 may be an elastic member coupled to base portion 16 that pulls pin 12 away from sensor 20. Some embodiments may omit spring 24 entirely. For example, pins 12 may be effectively propelled into holes 6 by the force of gravity. In certain embodiments, spring 24 may be a distinct component from pin 12, while in other embodiments, spring 24 may be an integral component of pin 12.

Pins 12 may have any structure, configuration, and/or function described above with respect to FIG. 2. For ease of illustration, only a single row of pins 12 (and other corresponding components) is shown, though other rows may be present. In the illustrated embodiments, pins 12 include coupler 26, which engages spring 24, and longitudinal axis 26.

Coupler 26 may be any structure operable to engage spring 24. In the illustrated embodiment, coupler 26 is a shoulder that spring 24 may press against. Such shoulders may also provide a precise "bottoming out" point for pin 12 that defines the position where pin 12 is maximally extended away from sensor 20. In other embodiments, coupler 26 may be a notch, hole, hook, or any suitable structure that is capable of engaging spring 24. Coupler 26 may be located at the same portion of pin 12, or coupler 26 may have different positions on different pins 12.

Longitudinal axis 28 represents the axis that extends through the length of pen 12. Because each pin 12 is situated within respective channels of base portions 16 and 18, pin 12 is capable of moving along longitudinal axis 28 toward or away from sensor 20. Because pins 12 are situated with respective channels of base portions 16 and 18, the channels in which a particular pin 12 sits may align with the longitudinal axis 28 of pin 12. In some embodiments, the projection of longitudinal axis 28 may intersect with sensing region 22 that is associated with pin 12 such that pin 12 contacts, or moves proximate to, without contacting, sensing region 22 when it moves a threshold distance toward sensor 20.

Figure 5A:
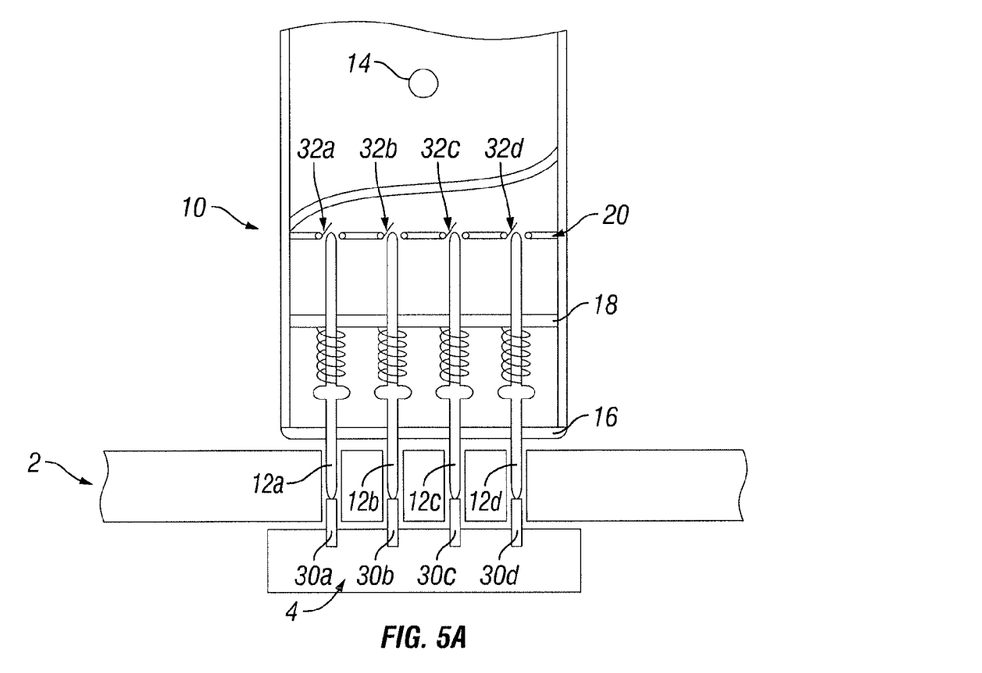
FIG. 5A illustrates a side view of a portion of an example pin verification device engaging an example circuit board.
Figure 5B:
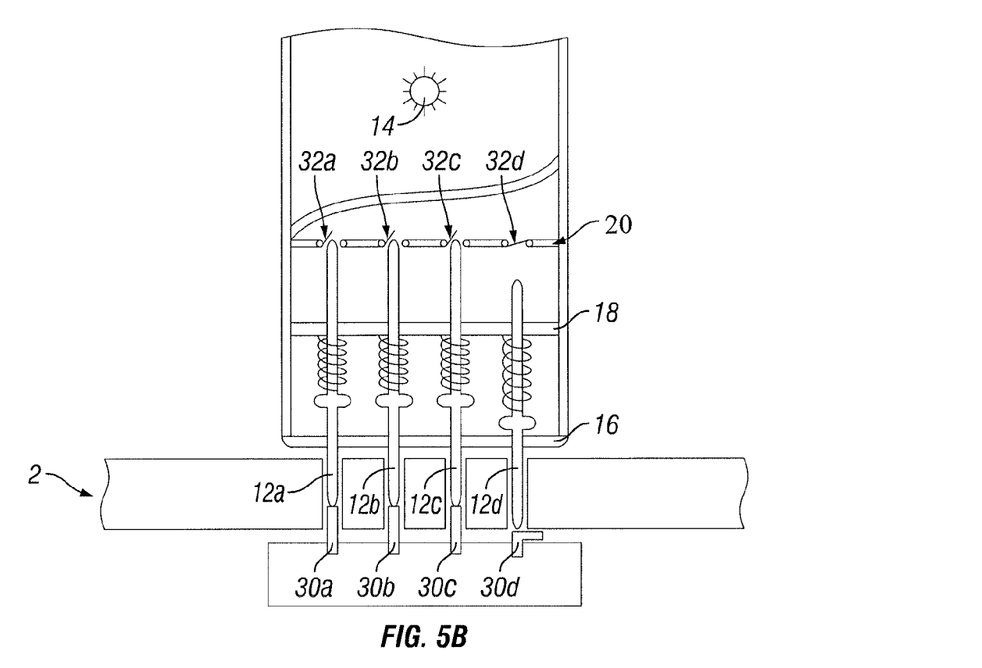
FIG. 5B illustrates a side view of a portion of an example pin verification device engaging an example circuit board.

FIGS. 5A-B illustrate side views of an example pin verification device 10 engaging an example circuit board 2. Circuit board 2 includes electronic component 4, which includes component pins 30a-d. In the illustrated embodiment, sensing regions 22 of sensor 20 include switches 32. For purposes of illustration, the bottom half of housing 15 has been cut out to show the internal components of pin verification device 10.

Component pin 30 may be any structure of electronic component 4 that is operable to engage hole 6 to facilitate data communication, power transfer, physical support, and/or any other suitable type of connection between circuit board 2 and electronic component 4. Component pin 30 may be a component lead, such as a wire or metal pin (e.g., a power bug pin), or any other structure operable to connect electronic component 4 to circuit board 2 via hole 6. In some embodiments, component pins 30 may require physical contact with hole 6 in order to perform one or more of these functions. For example, electrical contact between component pin 30a and hole 6a may be required to enable the flow of current between circuit board 2 and electronic component 4 (e.g., to facilitate data communication and/or power transfer). In some situations, one or more component pins 30 may not be sufficiently inserted into their respective holes 6 when electronic component 4 is attached to circuit board 2. For example, FIG. 5A shows component pins 30 that are sufficiently inserted into holes 6, while FIG. 5B shows that component pin 30d has been bent against circuit board 2 without sufficiently inserting into hole 6d. In certain situations, an improperly inserted component pin 30 may nevertheless register as "connected" using certain testing methods. For example, component pin 30d of FIG. 5B may have a small amount of electrical contact with hole 6d, and under test conditions, electrical connection tests may show that component pin 30d is electrically connected to a portion of hole 6d. However, a threshold amount of contact between component pin 30 and hole 6 may be needed to sustain communication and/or power transfer under operational conditions. Thus, though electronic component 4 shown in FIG. 5B may pass certain electrical tests, it may nevertheless fail when later used under operational conditions. Utilizing pin verification device 10 to verify proper insertion of component pins 30 may therefore provide improved testing of circuit boards by identifying improperly connected components that may pass other testing methods.

Switches 32 may be any circuit components operable to open or close a portion of a circuit in response to the proximity of pins 12. For example, switch 32 may be an analog switch that remains closed when pin 12 is not present and that opens when contacted by a rising pin 12. As another example, switch 32 may be an analog switch that remains open when pin 12 is not present and that closes when contacted by a rising pin 12. Such embodiments may provide a cost-efficient, simplified, and/or streamlined mechanism for detecting proper insertion of component pins 30. Switches 32 may allow pins 12 to move an additional distance after closing or opening switch 32. Such "give" may allow sensor 20 to register additional contacts by other pins 12 as they extend farther into their respective holes 6, which may allow pin verification device 10 to detect additional component pins 30 that may be inserted shorter, but still sufficient, distances into the other side of the holes 6. Certain embodiments of sensor 20 may have any suitable number, size, shape, and/or configuration of switches 32. For example, switches 32 may be arranged to correspond to the particular number, size, and arrangement of pins 12. Furthermore, in certain embodiments, the positions of switches 32 may be fixed, while in other embodiments, the positions may be adjustable. Additional circuitry (e.g. circuitry 40 of FIGS. 6A-B) may also be utilized to facilitate the sensing functionality of sensor 20.

In FIG. 5A, all component pins 30 are sufficiently inserted into holes 6. Accordingly, when pins 12 are inserted into the opposite side of holes 6, pins 12 may contact component pins 30, moving pins 12 toward sensor 20 as pin verification device 10 is pressed toward circuit board 2. Because all component pins 30 are properly inserted, each pin 12 is positioned proximate to switches 32. By contacting switches 32, pins 12 open each switch 32, which may allow sensor 20 to detect that all component pins 30 are properly inserted. For example, opening all switches 32 may cause a change in the state of indicator 14 (e.g., turning a light on or off). An example embodiment showing such operation is shown in FIG. 6A.

In FIG. 5B, component pins 30a-c are sufficiently inserted into holes 6a-c, respectively, but component pin 30d is not. Accordingly, when pins 12 are inserted into the opposite side of holes 6, pins 12a-c may contact component pins 30a-c, moving pins 12a-c into contact with switches 32a-c, respectively, as pin verification device 10 is pressed toward circuit board 2. However, because component pin 30d is not properly inserted, pin 12d may not contact switch 32d. The upward displacement of pin 12d may be halted by pins 12a-c hitting a stop as they push through switch 32, by base portion 16 contacting circuit board 2, or by any suitable mechanism. Because component pin 30d is not properly inserted, switch 32d remains open, which may allow sensor 20 to detect that all component pins 30 are not properly inserted. For example, leaving a single switch 32 open may affect the state of indicator 14 (e.g., causing a light to remain on or off). An example embodiment that may yield such operation is shown in FIG. 6A.

Figure 6A:
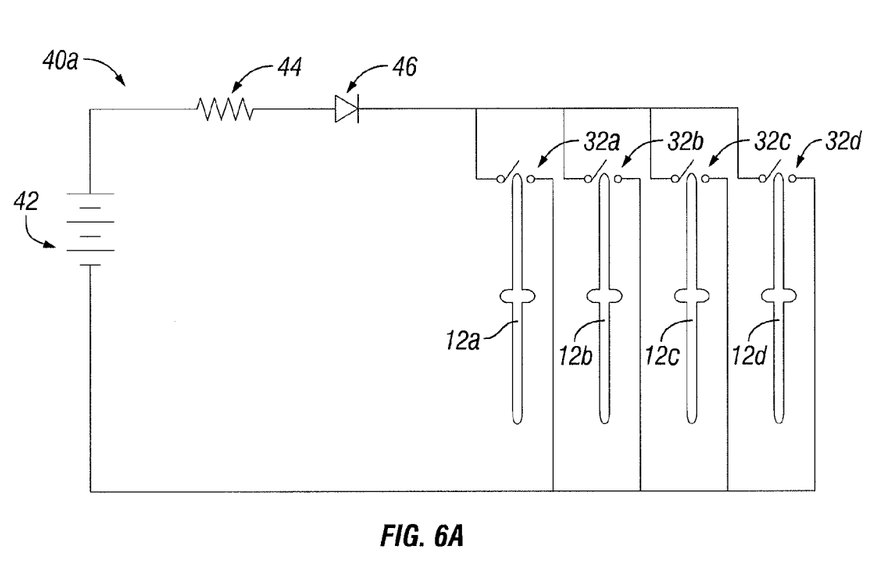
FIG. 6A illustrates example circuitry that may be used in certain embodiments of a pin verification device.
Figure 6B:
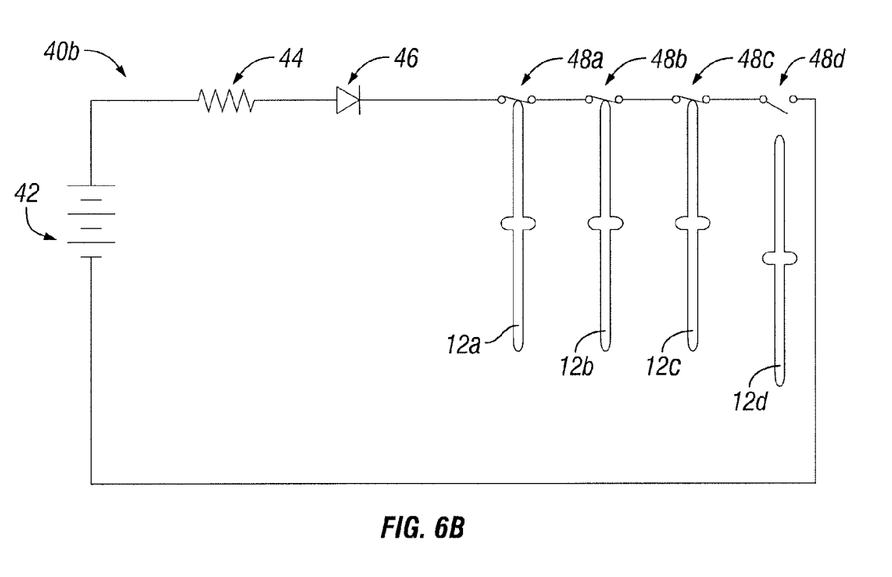
FIG. 6B illustrates example circuitry that may be used in certain embodiments of a pin verification device.

FIGS. 6A-B illustrate example embodiments of circuitry 40 that may be used in certain embodiments of a pin verification device 10. Circuitry 40a includes switches 32, battery 42, resistor 44, and light-emitting diode (LED) 46, which functions as indicator 14. Circuitry 40b includes switches 48, battery 42, resistor 44, and LED 46, which again functions as indicator 14.

Circuitry 40 may be any circuitry operable to determine whether all pins 12 are positioned proximate to sensing regions 22 (which are implemented by switches 32 in FIGS. 6A-B). Circuitry 40a and 40b show two alternative embodiments, though other configurations of circuitry 40 may be used. Circuitry 40a and 40b each include battery 42, resistor 44, and LEI) 46 connected in series. In operation, battery 42 provides current to power LED 46 when the circuit is completed. Such embodiments may provide improved detection of improperly connected electronic components 4. Such embodiments may also be more cost-efficient, use less power, and/or provide a simplified design compared to alternative devices and methods for detecting improperly connected electronic components 4.

Battery 42 is operable to provide current to one or more components of circuitry 40. Other embodiments of circuitry 40 may utilize other power sources in place of or in addition to battery 42. For example, some embodiments may have current supplied via an external power source, a solar panel, or any suitable current source.

Resistor 44 is operable to limit the amount of voltage and/or current supplied to LED 46 by battery 42. LED 46 may have certain voltage, current, and/or other requirements. In such embodiments, resistor 44 may operate as a limiting resistor to prevent the current and/or voltage supplied by battery 42 from exceeding the acceptable parameters for LED 46. Certain embodiments may utilize additional resistors 44, while other embodiments may omit resistor 44.

LED 46 functions as an indicator 14. Thus, the state of LED 46 may indicate whether all pins 12 are positioned proximate to switches 32 or 48. In other embodiments, LED 46 may be replaced by or supplemented with other indicators 14. For example, other embodiments may utilize sound-producing components, text and/or video displays, any other suitable indicator 14, or any combination thereof. As a particular example, some embodiments may feed the output of circuitry 40 into an input of a text display, rather than LED 46, to indicate whether all pins are positioned proximate to switches 32 or 48. Furthermore, certain embodiments may be configured to provide particularized indicators 14 for each switch 32 or 48 to enable precise determination of which component pin 30 is improperly inserted into hole 6.

In FIG. 6A, switches 32 are connected in parallel. Switches 32 may have any structure, configuration, and/or function discussed above with respect to switches 32 of FIG. 5A. Similar to switches 32 of FIG. 5A, switches 32 of FIG. 6A are configured to remain closed by default and may be pushed open by pins 12. Accordingly, if all pins 12 are not positioned proximate to the respective switch 32 (e.g., when a component pin 30 is not properly inserted into hole 6, as shown in FIG. 5B), one or more switches 32 remain closed, providing a closed circuit path that causes LED to receive power. All component pins 30 being sufficiently inserted into holes 6 may therefore cause LED 46 to remain off, while one or more component pins 30 being insufficiently inserted into holes 6 may cause LED 46 to be turned on. LEI) 46 may therefore provide a "failure" indicator. In FIG. 6A, since all pins 12 are opening switches 32, the circuit is not completed, and LED 46 is turned off. Similar configurations may be used to operate various types of indicators 14.

In FIG. 6B, switches 48 are connected in series. Switches 48 may have any structure, configuration, and/or function discussed above with respect to switches 32 of FIG. 5A. Unlike switches 32, switches 48 are configured to remain open by default and may be pushed closed by pins 12. Accordingly, if all pins 12 are not positioned proximate to the respective switch 48 (e.g., when a component pin 30 is not properly inserted into hole 6, as shown in FIG. 5B), one or more switches 48 remain open, preventing a completed circuit path. Because switches 48 are connected in series, only when all switches 48 are closed will LED 46 receive power from battery 42. All component pins 30 being sufficiently inserted into holes 6 may therefore cause LED 46 to turn on, while one or more component pins 30 being insufficiently inserted into holes 6 may cause LED 46 to remain off. LED 46 may therefore provide a "success" indicator. In FIG. 6B, since pin 12d is not closing switch 48d, the circuit is not completed, and LED 46 remains off. Similar configurations may be used to operate various types of indicators 14.

Other embodiments of circuitry 40 may utilize any suitable components. For example, certain embodiments may include one or more processors and/or computer-readable storage media implementing logic operable to determine whether all component pins 30 are sufficiently inserted into holes 6. Such components may be used in place of or in addition to the components of circuitry 40a and/or 40b. For example, circuitry 40b may provide an input signal for analysis by additional software embodied on a computer-readable storage medium. Furthermore, such software may provide a graphic display indicating whether component pins 30 are properly inserted into holes 6.

Herein, "or" is inclusive and not exclusive, unless expressly indicated otherwise or indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. For example, various embodiments may perform all, some, or none of the steps described above. Various embodiments may also perform the functions described in various orders.

Various embodiments disclosed herein may be used together in a variety of combinations. In various embodiments, pin verification device 10 may have different types, numbers, and configurations of pins 12, base portions 16 and 18, and sensors 20. For example, pin verification device 10 may utilize different numbers, sizes, and/or shapes of pins 12. Furthermore, the functionality of sensor 20 may be implemented using any number and types of hardware and/or software. For example, some embodiments may utilize analog switches, while others may utilize buttons, capacitive sensors, or any suitable components. Furthermore, multiple electronic components may be tested simultaneously. For example, in certain embodiments, multiple pin verification devices 10 may be used simultaneously to test the connections of multiple electronic components 4, or a single pin verification device 10 may include pins 12 and/or sensing regions 22 sufficient to test multiple electronic components 4.

Although the present invention has been described above in connection with several embodiments; changes, substitutions, variations, alterations, transformations, and modifications may be suggested to one skilled in the art, and it is intended that the present invention encompass such changes, substitutions, variations, alterations, transformations, and modifications as fall within the spirit and scope of the appended claims.

What is claimed is:

1. A device comprising:
   a sensor;
   an indicator electrically connected to the sensor;
   a first base portion comprising a plurality of first channels;
   a second base portion comprising a plurality of second channels, the second base portion located between the first base portion and the sensor; and
   a plurality of pins, each pin comprising first and second ends, each pin passing through a respective first channel of the plurality of first channels and a respective second channel of the plurality of second channels such that the first end extends beyond the first base portion away from the sensor and the second end extends beyond the second base portion toward the sensor, each pin adjustably disposed within the respective first and second channels such that each pin is independently operable to move along a longitudinal axis of the pin;
   wherein the sensor is operable to determine whether all pins of the plurality of pins are positioned proximate to the sensor.

2. The device of claim 1, wherein the indicator comprises a light operable to indicate whether all pins of the plurality of pins are positioned proximate to the sensor.

3. The device of claim 1, wherein:
   the sensor comprises a circuit having a plurality of sensing regions, each pin of the plurality of pins associated with a respective sensing region located at a projection of the longitudinal axis of the pin onto the sensor; and
   the sensor is configured to control a state of the indicator based on whether the second end of each pin is positioned proximate to the respective sensing region.

4. The device of claim 3, wherein each sensing region comprises a switch associated with a respective pin of the plurality of pins.

5. The device of claim 4, wherein each switch is connected in parallel and configured to:

remain closed when the respective pin is not positioned proximate to the switch; and open when the respective pin is positioned proximate to the switch.

6. The device of claim 4, wherein each switch is connected in series and configured to:

remain open when the respective pin is not positioned proximate to the switch; and close when the respective pin is positioned proximate to the switch.

7. The device of claim 1, wherein a location of each first channel within the first base portion is adjustable, and a location of each second channel within the second base portion is adjustable.

8. The device of claim 1, wherein determining whether all pins of the plurality of pins are positioned proximate to the sensor comprises changing a state of the indicator in response to all pins of the plurality of pins being positioned proximate to the sensor.

9. The device of claim 1, wherein determining whether all pins of the plurality of pins are positioned proximate to the sensor comprises changing a state of the indicator in response to one or more pins of the plurality of pins not being positioned proximate to the sensor.

10. The device of claim 1, wherein a distance between the sensor and the second base portion is adjustable.

11. The device of claim 1, wherein each pin of the plurality of pins has a width between 0.1 millimeter and 2 millimeters.

12. The device of claim 1, wherein the plurality of pins comprises two or more rows, each row comprising two or more pins.

13. The device of claim 1, further comprising a plurality of springs, each spring engaging a respective pin of the plurality of pins and operable to exert a force on the respective pin along the longitudinal axis of the pin away from the sensor.

14. A method of determining whether a plurality of component pins of a component coupled to a first side of a circuit board are inserted a sufficient depth into a plurality of holes of the circuit board, the method comprising:

positioning a device proximate to a second side of the circuit board, the second side opposite the first side, the device comprising:

a sensor;

an indicator electrically connected to the sensor;

a first base portion comprising a plurality of first channels;

a second base portion comprising a plurality of second channels, the second base portion located between the first base portion and the sensor; and a plurality of pins, each pin comprising first and second ends, each pin passing through a respective first channel of the plurality of first channels and a respective second channel of the plurality of second channels such that the first end extends beyond the first base portion away from the sensor and the second end extends beyond the second base portion toward the sensor, each pin adjustably disposed within the respective first and second channels such that each pin is independently operable to move along a longitudinal axis of the pin;

wherein the sensor is operable to determine whether all pins of the plurality of pins are positioned proximate to the sensor, and wherein the device is positioned such that each pin of the plurality of pins is aligned with a respective hole of the plurality of holes;

inserting the plurality of pins into the respective holes such that one or more first ends of the plurality of pins contacts one or more component pins; and determining whether the plurality of component pins are inserted a sufficient depth into the plurality of holes based on the state of the indicator.

15. The method of claim 14, wherein:

the sensor comprises a circuit having a plurality of sensing regions, each pin of the plurality of pins associated with a respective sensing region located at a projection of the longitudinal axis of the pin onto the sensor; and the sensor is configured to control a state of the indicator based on whether the second end of each pin is positioned proximate to the respective sensing region.

16. The method of claim 15, wherein each sensing region comprises a switch associated with a respective pin of the plurality of pins, each switch connected in parallel and configured to:

remain closed when the respective pin is not positioned proximate to the switch; and open when the respective pin is positioned proximate to the switch.

17. The method of claim 15, wherein each sensing region comprises a switch associated with a respective pin of the plurality of pins, each switch connected in series and configured to:

remain open when the respective pin is not positioned proximate to the switch; and close when the respective pin is positioned proximate to the switch.

18. The method of claim 14, wherein determining whether all pins of the plurality of pins are positioned proximate to the sensor comprises changing a state of the indicator in response to all pins of the plurality of pins being positioned proximate to the sensor.

19. The method of claim 14, wherein determining whether all pins of the plurality of pins are positioned proximate to the sensor comprises changing a state of the indicator in response to one or more pins of the plurality of pins not being positioned proximate to the sensor.

20. A device comprising:

a housing;

a sensor situated within the housing;

an indicator electrically connected to the sensor;

a first base plate connected to a first end of the housing, the first base plate comprising a plurality of first channels;

a second base plate situated within the housing between the first base plate and the sensor, the second base plate comprising a plurality of second channels;

two or more rows of pins, each row comprising two or more pins, each pin comprising first and second ends, each pin passing through a respective first channel of the plurality of first channels and a respective second channel of the plurality of second channels such that the first end extends beyond the first base portion away from the sensor and the second end extends beyond the second base portion toward the sensor, each pin adjustably disposed within the respective first and second channels such that each pin is independently operable to move along a longitudinal axis of the pin; and a plurality of springs, each spring engaging a respective pin of the plurality of pins and operable to exert a force on the respective pin along the longitudinal axis of the respective pin away from the sensor;

wherein the sensor is operable to determine whether all pins of the plurality of pins are positioned proximate to the sensor.

* * * * *